(12) United States Patent
Ference et al.

(10) Patent No.: US 6,858,941 B2
(45) Date of Patent: Feb. 22, 2005

(54) MULTI-CHIP STACK AND METHOD OF FABRICATION UTILIZING SELF-ALIGNING ELECTRICAL CONTACT ARRAY

(75) Inventors: Thomas George Ference, Essex Junction, VT (US); Wayne John Howell, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/732,240

(22) Filed: Dec. 7, 2000

(65) Prior Publication Data

US 2002/0070438 A1 Jun. 13, 2002

(51) Int. Cl.⁷ .......................... H01L 23/48; H01L 23/52; H01L 29/40
(52) U.S. Cl. ...................... 257/781; 257/777; 257/778; 257/779; 257/780; 257/686; 438/108; 438/109; 361/760
(58) Field of Search ................................. 257/777–781, 257/723, 724, 685, 686, 690, 700; 438/108, 109; 361/760

(56) References Cited

U.S. PATENT DOCUMENTS

| | | | |
|---|---|---|---|
| 3,869,787 A | | 3/1975 | Umbaugh ..................... 29/577 |
| 4,032,058 A | | 6/1977 | Riseman ..................... 228/180 |
| 4,182,781 A | | 1/1980 | Hooper et al. ................. 427/90 |
| 4,487,654 A | | 12/1984 | Coppin ....................... 156/645 |
| 5,060,844 A | * | 10/1991 | Behun et al. ............ 228/180.21 |
| 5,226,232 A | | 7/1993 | Boyd .......................... 29/846 |
| 5,381,307 A | | 1/1995 | Hertz et al. .................. 361/767 |
| 5,497,258 A | * | 3/1996 | Ju et al. ....................... 349/58 |
| 5,567,295 A | | 10/1996 | Swamy et al. ............... 205/125 |
| 5,567,654 A | | 10/1996 | Beilstein, Jr. et al. ....... 437/209 |
| 5,569,960 A | * | 10/1996 | Kumazawa et al. .......... 257/738 |
| 5,598,036 A | * | 1/1997 | Ho ............................... 257/738 |
| 5,646,828 A | * | 7/1997 | Degani et al. ............... 361/715 |
| 5,796,169 A | * | 8/1998 | Dockerty et al. ............ 257/780 |
| 5,796,591 A | * | 8/1998 | Dalal et al. .................. 361/779 |
| 5,863,406 A | | 1/1999 | Mazzoni et al. ............. 205/126 |
| 5,907,187 A | * | 5/1999 | Koiwa et al. ................ 257/737 |
| 5,977,640 A | * | 11/1999 | Bertin et al. ................. 257/777 |
| 6,133,637 A | * | 10/2000 | Hikita et al. ................. 257/777 |
| 6,137,184 A | * | 10/2000 | Ikegami ....................... 257/785 |
| 6,166,556 A | * | 12/2000 | Wang et al. .................. 324/765 |
| 6,222,277 B1 | * | 4/2001 | Downes ....................... 257/778 |
| 6,225,700 B1 | * | 5/2001 | Ito et al. ...................... 257/780 |
| 6,268,739 B1 | * | 7/2001 | Bernier et al. ............... 324/755 |
| 6,337,522 B1 | * | 1/2002 | Kang et al. .................. 257/784 |

FOREIGN PATENT DOCUMENTS

| | | | |
|---|---|---|---|
| JP | 04088645 A | * | 3/1992 |
| JP | 05-190553 | | 7/1993 |

OTHER PUBLICATIONS

Periodic Table of the Elements.*

* cited by examiner

Primary Examiner—George Eckert
Assistant Examiner—Chris C Chu
(74) Attorney, Agent, or Firm—Robert A. Walsh, Esq.; Kevin P. Radigan, Esq.; Heslin Rothenberg Farley & Mesiti P.C.

(57) ABSTRACT

A multi-chip stack structure and method of fabrication are provided utilizing self-aligning electrical contact arrays. Two or more arrays of interconnection contacts are provided, with one array being a rough aligned contact array, and a second array being a high bandwidth contact array. The rough aligned contact array has larger contacts and at least a portion thereof which melts at a substantially lower temperature than the melting temperature of the contacts of the high bandwidth contact array. By positioning two integrated circuit chips in opposing relation with the arrays mechanically aligned therebetween, and applying heat to melt the contacts of the rough aligned array, the two chips will rotate to align the respective contacts of the high bandwidth contact arrays, thereby achieving improved connection reliability between the structures.

18 Claims, 6 Drawing Sheets fig. 1 fig. 2 fig. 3 fig. 4 fig. 4A fig. 4B fig. 5 fig. 5A fig. 6A fig. 6B fig. 6C

MULTI-CHIP STACK AND METHOD OF FABRICATION UTILIZING SELF-ALIGNING ELECTRICAL CONTACT ARRAY

TECHNICAL FIELD

The present invention relates in general to high density electronic packaging, and more particularly, to a multi-chip stack structure and fabrication approach employing multiple arrays of electrical contacts that are self-aligning to improve reliability and manufacturability of the structure.

BACKGROUND OF THE INVENTION

Since the development of integrated circuit technology, computers and computer storage devices have been made from integrated circuit chips formed from wafers of semiconductor material. After a wafer is made, the chips are typically separated from each other by dicing the wafer. Thereafter, the individual chips are bonded to carriers of various types, interconnected by wires and packaged. As technology enhancements increase, more circuits are required per chip. This is typically accomplished by (a) making the circuits smaller and (b) making the chips larger. However, there is a practical limit to both. Making chips larger requires larger field size optics, which are now at a physical limitation. Thus, increasing the density by expanding the "two dimensions" of the chips becomes prohibitive. Physical chip size limitations can be overcome by making chips as large as possible, and dividing the required circuit function into two or more chips, which are electrically connected together. However, this introduces new electrical interconnection issues.

Recently, semiconductor structures comprising three-dimensional arrays of two or more chips have emerged as an important packaging approach. A typical three-dimensional electronic module (one example of a semiconductor structure) includes multiple integrated circuit chips adhesively secured together as a monolithic structure (i.e., a "stack"). Significant attention has been directed to providing interconnections for the chips in such a multi-chip stack structure. For example, reference U.S. Pat. No. 5,567,654, which is hereby incorporated herein by reference in its entirety.

The conventional requirement for smaller component device dimensions is in direct conflict with the requirement for an increased number of interconnections between chips, because the former tends to reduce the available surface area for interconnection, while the latter demands more interconnections within the available surface area. That is, smaller component device dimensions increasingly limit the available space for interconnecting component devices, while increasing the number of connections between component devices requires more space (which is often not available) for interconnecting the component devices or a finer pitch, i.e., finer resolution, between adjacent interconnections within the available space. Unfortunately, contemporary manufacturing technology has been limited in the minimum pitch that can be used for interconnecting component devices within available space. For example, practically, the placement of component devices on circuit supporting substrates and the interconnection of those substrates becomes prone to errors as the pitch of the interconnections approaches the limit of the technology.

Thus, self-aligning electrical contacts are deemed desirable to facilitate dense electrical interconnection of two or more integrated circuit structures, such as in a multi-chip stack package.

DISCLOSURE OF THE INVENTION

Although principally described hereinbelow with reference to a dual-chip stack structure, the electrical interconnection concepts of the present invention can be readily applied to other integrated circuit structures, such as any multi-chip stack or to interconnection of an integrated circuit chip and carrier structure.

A significant advantage of dual-chip stack technology is that the technology enables extremely high input/output (I/O) density between two interconnected chips. In order to achieve this high I/O density, the size and pitch of the electrical interconnection array (for example, a solder bump interconnection array) must be significantly reduced between the chips. Because the coefficient of thermal expansion (CTE) is typically matched between two interconnected chips, there is less concern about solder bump fatigue. A reduced size/pitch solder bump array does present a substantial challenge for a dual-chip stack assembly in that slight misalignment of the two chips could result in a mis-interconnection between the two chips, i.e. one chip could be shifted relative to the other chip resulting in having the wrong electrical connections between the two chips. This would probably result in a non-functional multi-chip stack.

Current solder bump array deposition technologies require an expensive and time-consuming mask alignment process. This alignment process becomes increasingly difficult and costly as the solder bump size and pitch is decreased. To realize the full advantages of multi-chip stack technology, such as provided by a dual-chip stack, one needs to have a very high solder bump interconnection density. Unfortunately, a dual-chip stack structure may suffer the expense and inherent technology limitations associated with the current solder bump array technologies. The present invention is designed to address these inherent limitations, and thereby provide an improved chip stack structure.

Briefly, the present invention comprises in one aspect a structure which includes a first substrate and a second substrate. First solder bumps and second solder bumps are disposed between the first substrate and the second substrate. The second solder bumps have at least a portion thereof that melts at a substantially lower temperature than the first solder bumps. Advantageously, the second solder bumps can thus be employed to self-align the first and second substrates without requiring melting of the first solder bumps.

In another aspect, a method of joining is presented which includes: providing a first substrate and a second substrate; and providing first solder bumps and second solder bumps connecting the first substrate and the second substrate, wherein the second solder bumps have at least a portion that melts at a substantially lower temperature than the first solder bumps.

In an enhanced aspect, the method further includes: mounting the first substrate on the second substrate; heating to melt at least a portion of the second solder bumps without melting the first solder bumps, wherein after the melting occurs, the first substrate aligns with the second substrate; and heating to melt at least a portion of the first solder bumps to form the interconnected structure, wherein the first solder bumps wet and electrically connect the first substrate and the second substrate, and wherein the second solder bumps are for aligning the first substrate and the second substrate before melting of the first solder bumps.

Additional features and advantages are realized through the techniques of the present invention. Other embodiments and aspects of the invention are described in detail herein and are considered a part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, the present invention comprises a self-aligning electrical interconnection approach for connecting, for example, a first integrated circuit chip and a second integrated circuit chip in a dual-chip stack configuration. This self-aligning interconnection approach employs two or more interconnection arrays, with one array comprising a rough aligned contact array, and a second array comprising a high bandwidth contact array, wherein the rough aligned contact array comprises larger contacts than the contacts of the high bandwidth contact array. As described further below, the rough aligned contact array is fabricated so that the contacts have a lower melting point than the contacts of the high bandwidth contact array. Therefore, by mounting, for example, a first integrated circuit chip on top of a second integrated circuit chip and heating to melt the contacts of the rough aligned contact array, the two chips will rotate to align their respective contacts of the high bandwidth contact array.

Again, although described principally herein with reference to a dual-chip stack structure, the electrical interconnection concepts of the present invention can be readily applied to other integrated circuit structures, such as to any multi-chip stack or to connection of an integrated circuit chip and a carrier structure. Further, the "contact arrays" are described herein as comprising "solder bump" arrays. The phrase "solder bump" is intended to be inclusive of any electrical contact employed in integrated circuit or chip carrier connection technology. Thus, "solder bump" as used herein means any electrical contact, bump or pad, that at least partially contains solder. For example, connection between contacts of the high bandwidth contact arrays of a first integrated circuit chip and a second integrated circuit chip could be merely by physical contact of opposing electrical contacts.

In a first embodiment of the present invention, a process of building a dual-chip stack structure is possible using a rough aligned contact array and a high bandwidth contact array. These contact arrays, also referred to herein as solder bump arrays, can be defined using electroless and electrolytic plating processes as described hereinbelow. Thus, a technique is presented for a self-aligned deposition process that does not require the use of a photolithographic process.

Electroplating is one of the current techniques employed for depositing Contact Collapse Chip Connections (C4s, i.e., a BLM (Ball Limiting Metallurgy) and solder bump on top of the BLM). Currently, electroplating is limited to depositing a uniform size C4, i.e., variable sized C4s across a chip have not been practiced. The current technology for fabricating electroplated C4s requires the deposition of patterned solder on top of a blanket deposited BLM metalization. The solder is then used as an etch mask for patterning the BLM metalization. Further details of solder bump array fabrication are provided in a textbook entitled *Electroless and Electrolytic plating reference: Microelectronics Packaging Handbook*, edited by Rao R. Tummala and Eugene J. Rymaszewski, Van Nostrand Reinhold, 1989.

Figure 1:
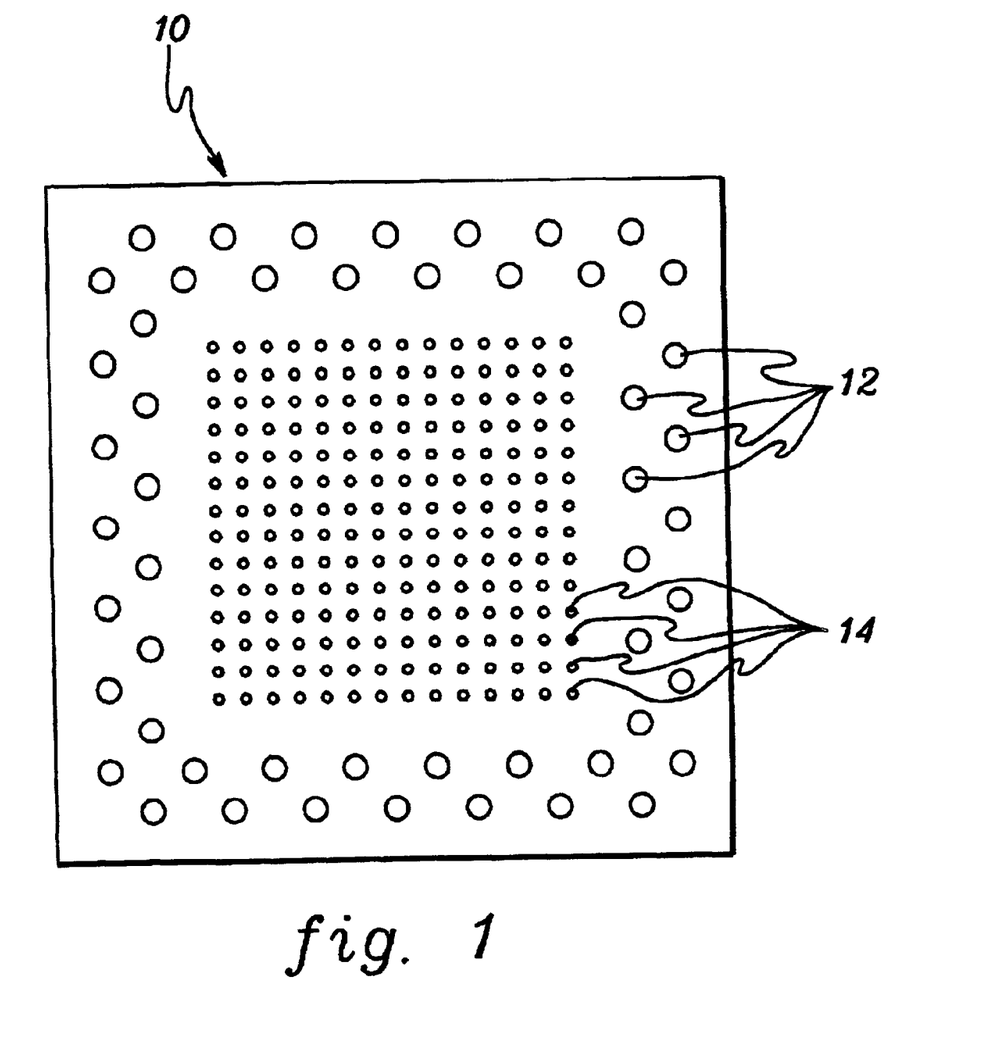
FIG. 1 is a plan view of one embodiment of a first semiconductor chip to be connected to a second semiconductor chip in a dual-chip stack in accordance with the principles of the present invention.
Figure 2:
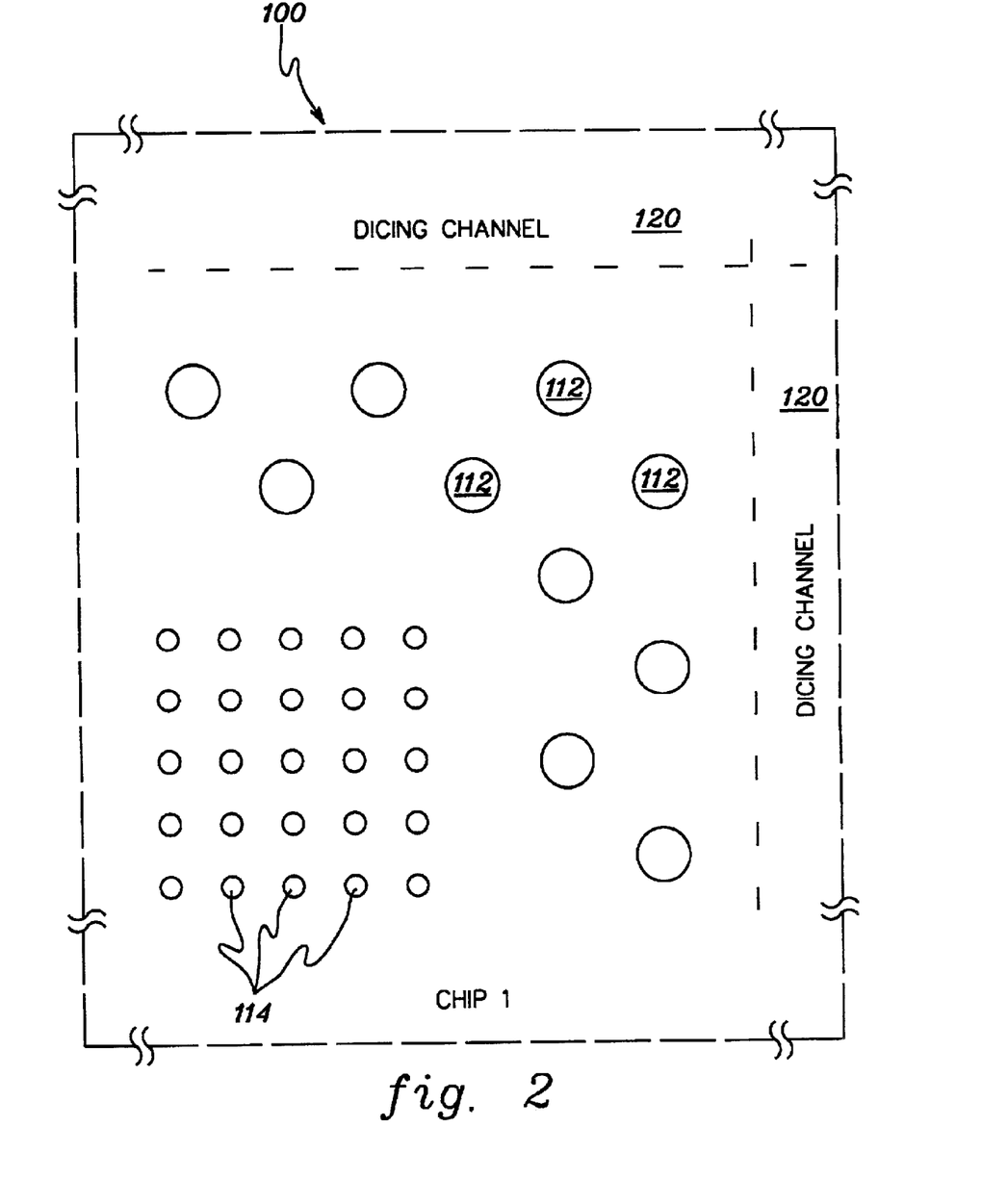
FIG. 2 is an enlarged partial plan view of a first semiconductor wafer in accordance with the principles of the present invention.
Figure 3:
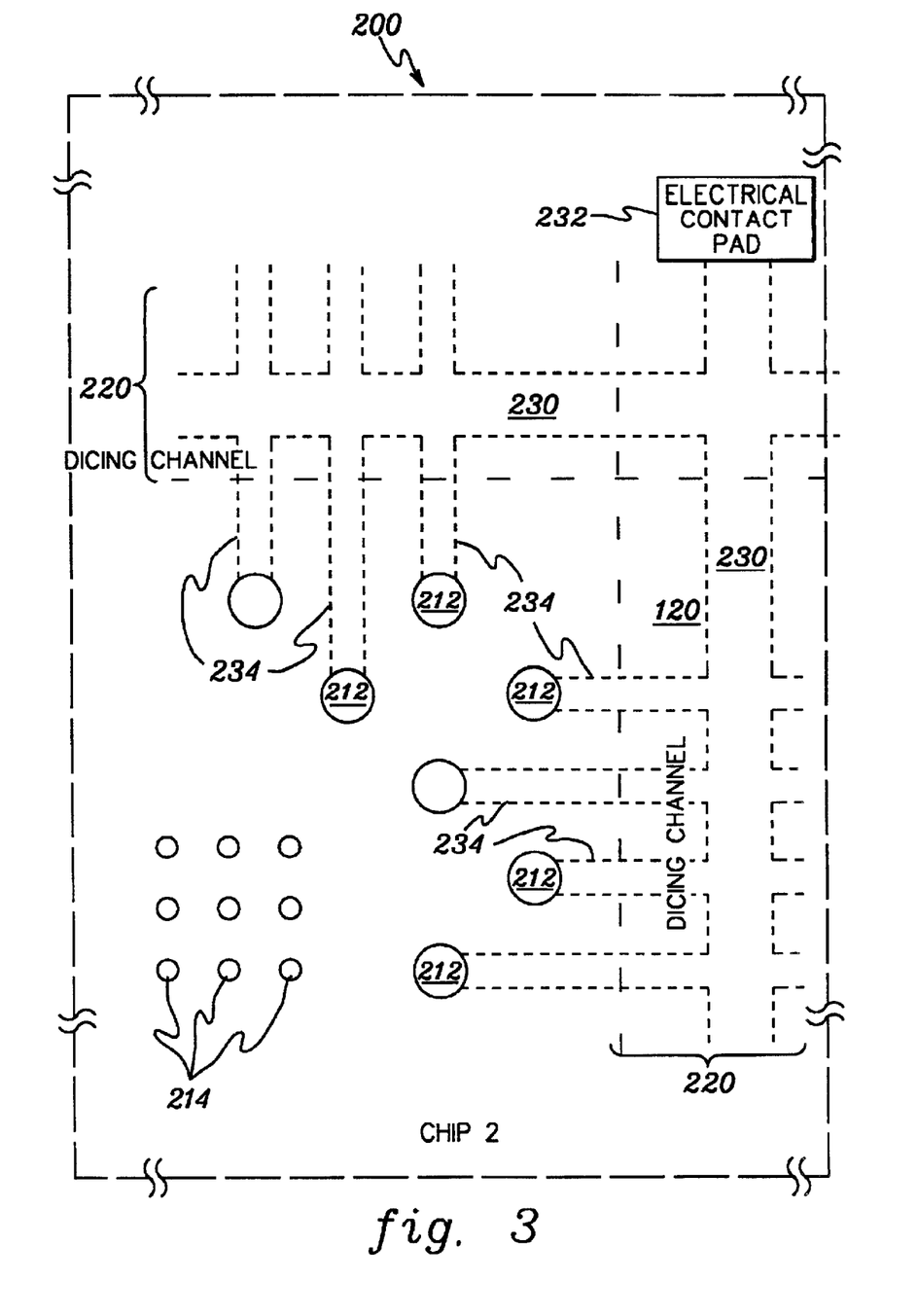
FIG. 3 is an enlarged partial plan view of a second semiconductor wafer in accordance with the principles of the present invention showing rough aligned solder bumps and high bandwidth solder bumps.

Fine alignment of a high density contact array, such as a C4 array, is achieved in the present invention through the use of the rough alignment contact arrays. One embodiment of an integrated circuit chip 10 having both rough aligned and high bandwidth arrays is shown in FIGS. 1, 2 & 3. In FIG. 1, the rough aligned contact array contains larger contacts 12 (e.g., C4) compared with the high bandwidth (i.e., high density) contacts 14 (also, e.g., C4). The high bandwidth contacts are of much smaller size and tighter pitch than those of the rough aligned contact array.

In the embodiment depicted, the rough aligned contacts 12 are disposed along a perimeter of the integrated circuit chip 10, while the high bandwidth contact array is in the center of integrated circuit chip 10.

In FIG. 2, the integrated circuit die is shown still within a wafer 100. The resultant chip is to be defined by dicing the wafer along channels 120. In this embodiment, the rough aligned contact pads 112 are again shown along a perimeter of the integrated circuit die, while high bandwidth pads 114 are disposed near a center of the die.

As explained further below, connecting an integrated circuit chip 10 (FIG. 1) to another structure in accordance with this invention has multiple levels of tolerance. First, for example, there is a mechanical placement tolerance (which in one example may be approximately 10 microns) of one chip being mounted on another chip. Next, there is a rough aligned contact tolerance wherein by reflowing only the rough aligned contacts, the two chips in a dual-chip stack structure will inherently move or rotate to better align. This alignment tolerance may be in one example 0.5 microns. Thus, the reflowing of only the rough aligned contacts provides another level of alignment between the two chips with the result being that the high pitch contact arrays are lined up more closely between the upper integrated circuit chip and lower integrated circuit chip.

The alignment (movement and rotation) characteristics are a result of the high surface tension for liquid solder.

During the interconnection process the solder melts, making a connection between the contacts on the two chips (114 and 214). Thermodynamics requires that the interfacial energy of the entire array of solder bumps be minimized, which can only happen if the cumulative exposed surface area of the solder bump array is minimized. This happens when the two chips become aligned, one on top of the other. Because the solder tension of liquid solder is large it will cause physical movement of the upper chip.

FIG. 3 depicts a second semiconductor wafer 200 which includes a second integrated circuit die having rough aligned contacts 212 and high bandwidth contacts 214, which are disposed to align to contacts 112 and 114 of integrated circuit chip 1 of FIG. 1 after dicing of the integrated circuit die from the respective wafers, and placement of the chips in opposing relation. In this embodiment, electroplating bussing connections 234 and 230 are employed to electrically connect the rough aligned contacts through the dicing channels 220. These bussing connections enable the deposition of additional solder subsequent, e.g., to an electroless BLM and solder plating process which can be used to create the high bandwidth and rough aligned C4s as described above. Connection through the electroplating bussing is via one or more electrical contact pads 232, again disposed within the dicing channels.

Figure 4:
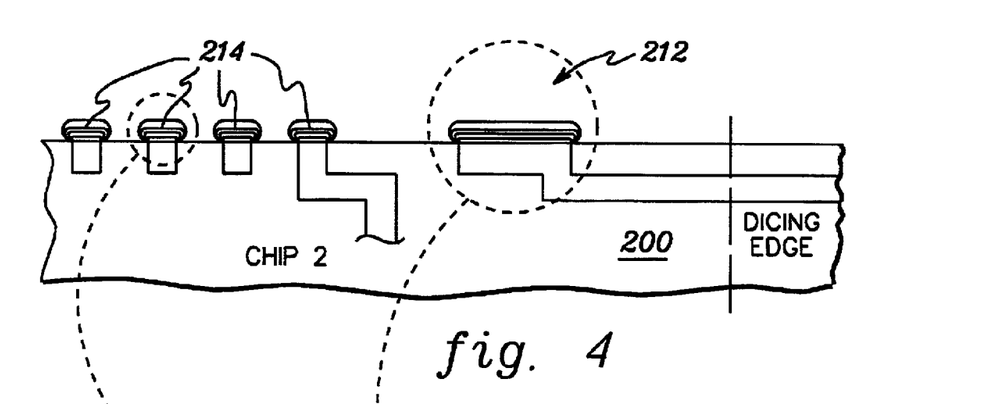
FIG. 4 is a partial cross-sectional view of one intermediate embodiment of a second semiconductor chip having multiple arrays of solder bumps in accordance with the principles of the present invention.
Figure 4A:
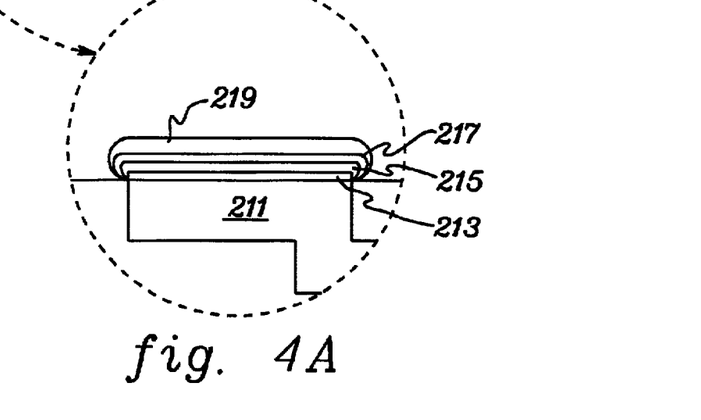
FIG. 4A is an enlarged view of the high bandwidth and rough aligned solder bumps of FIG. 4 in accordance with the principles of the present invention.
Figure 4B:
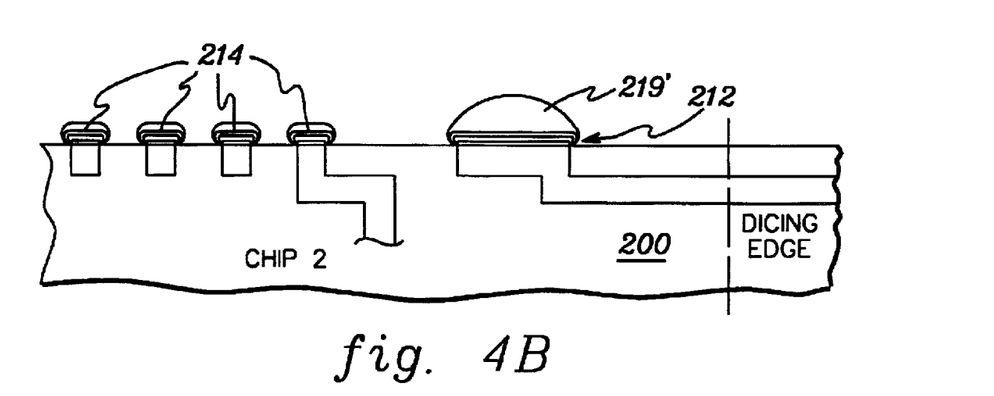
FIG. 4B is a partial cross-sectional view of the second semiconductor chip of FIG. 4 after electroplated solder has been selectively deposited onto the rough aligned contacts.

FIGS. 4, 4A & 4B depict a cross-sectional view of one embodiment of semiconductor wafer 200 wherein both high bandwidth contacts 214 and rough aligned contacts 212 are shown in greater detail. In one embodiment, contacts 214 and 212 electrically connect to wiring 211 (such as copper lines) within the semiconductor wafer wiring levels. In such an embodiment, the contacts may comprise a multilayer structure wherein a first layer 213 is a copper layer 213, a second layer 215 comprises nickel, and a third layer 217 comprises gold. As shown in FIGS. 4 & 4A, a layer of solder 219 is deposited over gold layer 217 on both the high bandwidth contacts 214 and the rough aligned contacts 212. This solder deposition can be achieved using an electroless plating process or "Super Solder". Super Solder is marketed by Super Solder Technologies, Inc., which is a joint venture between Harima Chemical Corp. and Furukawa Electric Company, Ltd., both of Japan. As shown in FIG. 4B, a subsequent solder deposition, using an electroplating process, results in additional solder 219' deposited on the rough aligned contacts 212. Again, the result of the processing depicted in FIGS. 3, 4 & 4B is that additional solder is selectively deposited onto only the rough aligned contacts.

Figure 5:
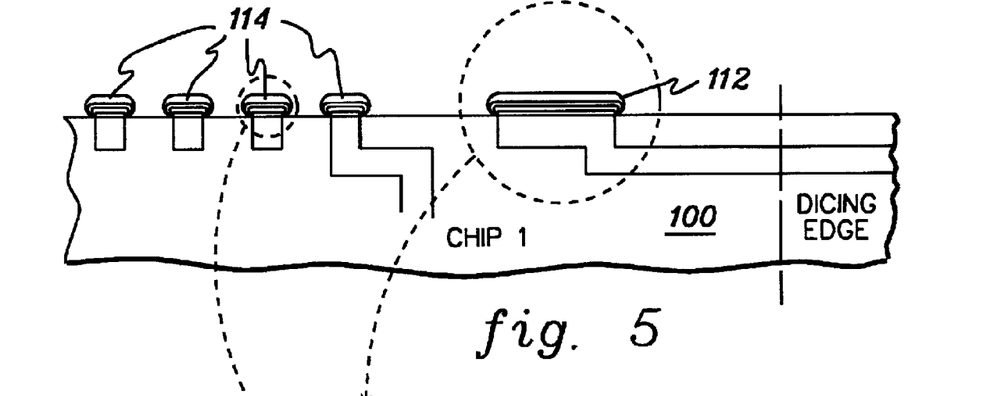
FIG. 5 is a partial cross-sectional view of one embodiment of a first semiconductor chip employing multiple arrays of solder bumps in accordance with the principles of the present invention.
Figure 5A:
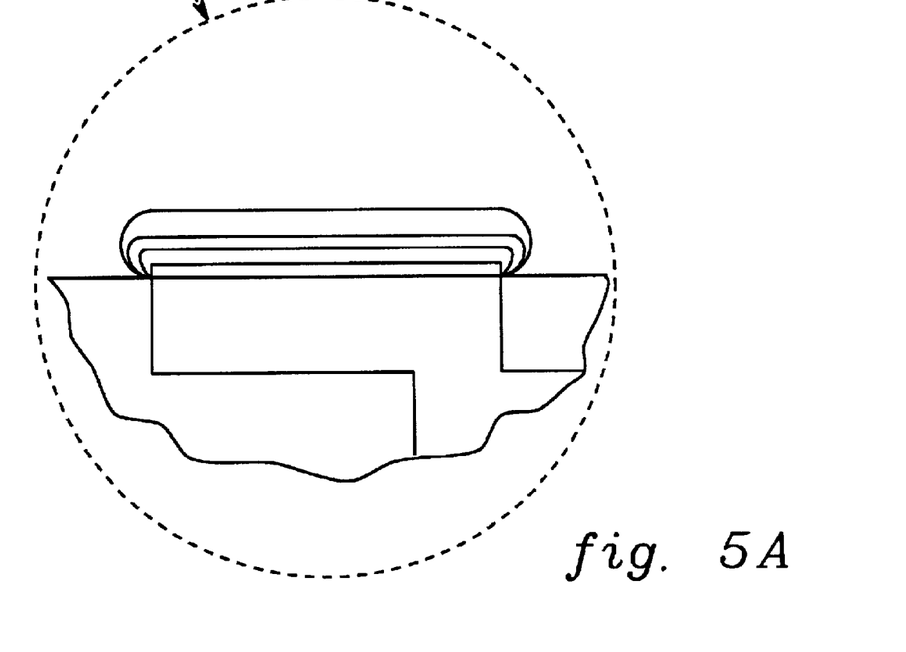
FIG. 5A is an enlarged view of a rough aligned solder bump of FIG. 5 in accordance with the present invention.

FIGS. 5 & 5A are a cross-sectional view of integrated circuit chip 100 (FIG. 3)(i.e., chip 1) which is also to form a portion of a dual-chip stack in accordance with the present invention. In this embodiment, solder height on both the rough aligned contacts and the high bandwidth contacts is substantially the same. (This is possible since there is a solder height difference between the rough aligned contacts and high bandwidth contacts on the mating chip (i.e., chip 2) as shown in 4B.) A multilayer contact structure is again employed for integrated circuit chip 1.

Assuming copper interconnection within the semiconductor chip, then the multilayer structure may comprise a nickel layer on top of a copper layer which is covered by a gold layer, which is then electroless plated or provided with "super solder". In one embodiment "super solder" comprises a tin solder bound to an organic module. As an alternative embodiment, the fine aligned contacts 114 & 214 could comprise gold to gold physical contacts with no solder interconnection between them.

Figure 6A:
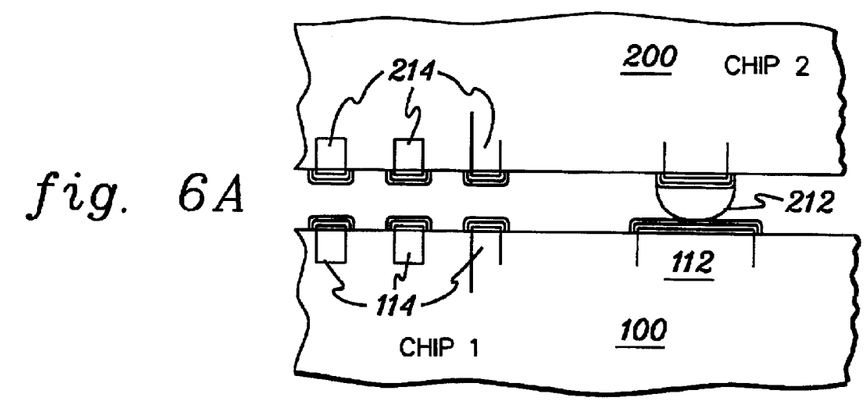
FIGS. 6A–6C are partial cross-sectional views of a dual-chip stack aligned and electrically connected in accordance with the principles of the present invention.
Figure 6B:
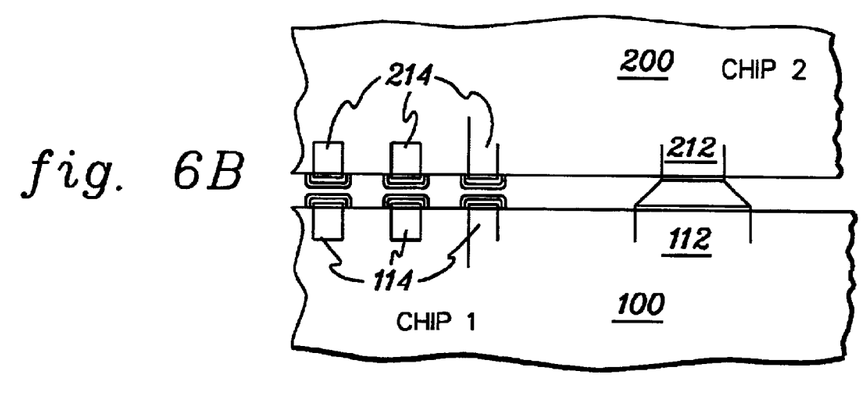
Figure 6C:
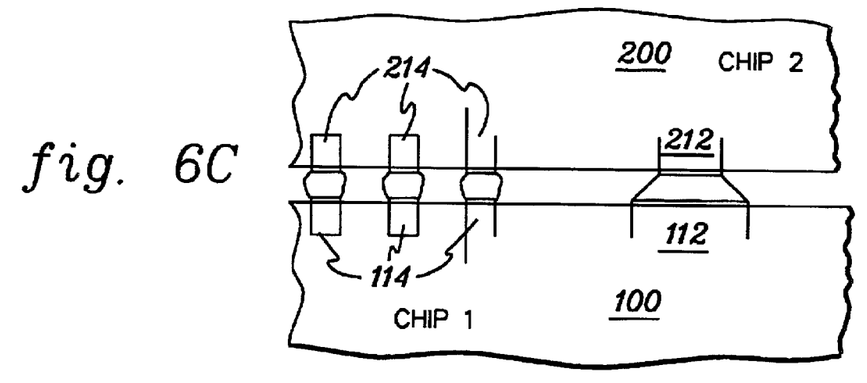

FIGS. 6A–6C depict one process embodiment for joining a first integrated circuit chip and a second integrated circuit chip in accordance with the principles of the present invention. In this embodiment, the second integrated circuit chip is mounted atop the first integrated circuit chip by mechanical placement techniques such that the electroplated solder bump of the rough aligned contacts 212 of chip 200 align to an upper surface of a respective rough aligned contact 112 of integrated circuit chip 100. This placement may be done at room temperature. Thereafter, a low temperature reflow of the rough aligned contacts is performed by melting a portion of the rough aligned contacts, which are designed with a lower melting temperature, for example, a melting temperature that is at least 25° Celsius lower than the melting temperature of the high bandwidth contacts. As described above, the melting of the rough aligned contacts results in alignment of the second integrated circuit chip to the first integrated circuit chip to a greater tolerance than can be achieved with simple mechanical placement. (The high tension forces associated with liquid solder result in the self-alignment characteristics. These surface tension forces are not size-dependent, so the rough aligned solder bumps can achieve the same alignment tolerances as the small solder bumps.) As shown in FIGS. 6A & 6B, two different rough aligned contact pad diameters are preferably used in order to ensure that the high bandwidth contacts achieve the correct separation necessary for successfully joining during a high temperature reflow. The result of a high temperature reflow is depicted in FIG. 6C wherein the high temperature solder surrounding contacts 114 and 214 is also reflowed thereby providing electrical connection between all contacts of the two chips.

Those skilled in the art will note that the use of the electroless plating process described for the deposition of the contacts and solder provides low-cost, self-aligned, high density contact arrays for dual-chip stack interconnection. "Super solder" can be used in place of the electroless plating process for solder deposition onto the electroless BLM array. This again would provide a low-cost, self-aligned, high density contact array for dual-chip stack interconnection.

In an alternate embodiment, the above-described contact alignment concepts can be employed to build a dual-chip stack structure utilizing only electroplating technology. This alternate technique would require a photolithographic masking step to align the contacts to the underlying back end of line "BEOL" metallurgy. ("BEOL" metallurgy is the thin film wiring layers that are created on a wafer and used to interconnect the active devices on the integrated circuit chips and the input/output contacts on the chip (e.g., contacts 114 & 214). Fine alignment of a high density contact array can be achieved through the use of a rough aligned contact array. The high bandwidth (i.e., high density) array would be much smaller and tighter pitched than the rough aligned array.

Electroplated contact array technology, with its unique ability to create small, closely spaced features, is employed to create the high bandwidth contact array. Unfortunately, current electroplated technology cannot create features that are markedly different in size, or markedly different in solder volume, as is desirable for the rough aligned contact array. One solution to this problem is to use electroplating bussing connects for the rough aligned contact array within the dicing channels of the wafer as shown in FIG. 3. These bussing connections enable one to deposit additional solder subsequent to the standard contact plating process which is used to create the high bandwidth and rough aligned contacts. This would allow additional solder to be selectively deposited onto only the rough aligned contacts in a manner such as described above.

By way of further explanation, one process example for fabricating the structures of the present invention would be as follows:

1. Create Cu BEOL wiring (211,111)
2. Electroless Cu deposition (213 and 113) onto 211 and 111
3. Electroless Ni deposition (215 and 115) onto 213 and 113
4. Electroless or Immersion Au deposition (217 and 117) onto 215 and 115
5. Electroless Solder (or Super-Solder) deposition onto 217 and 117
6. Electrolytic solder deposition (219) onto 217, where electrical connection necessary for the deposition is provided 234. External electrical contact to the lines 230 is provided by contact pad 232.

Although solder compositions can vary, in one example, the compositions may be as follows:

Electroless Solder: Pb/Sn, typically high % Pb (>90% by weight)

Super Solder: Pb/Sn, typically high % Pb (>90% by weight)

Electrolytic Solder: Pb/Sn, typically eutectic composition (63% by weight Sn)

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A structure comprising:
    a first substrate and a second substrate; and
    first reflowed solder bumps and second reflowed solder bumps offset therebetween, wherein said first reflowed solder bumps and said second reflowed solder bumps are separate solder bumps disposed between said first substrate and said second substrate, and wherein said second reflowed solder bumps have at least a portion that melts at a lower temperature than said first reflowed solder bumps; and
    wherein said second reflowed solder bumps comprise alignment solder bumps which aligned said first reflowed solder bumps between said first substrate and said second substrate before said first reflowed solder bumps were reflowed.

2. A structure as recited in claim 1, wherein said second solder bumps are larger than said first solder bumps.

3. A structure as recited in claim 1, wherein said second solder bumps comprise a portion having a higher concentration of tin than does said first solder bumps.

4. A structure as recited in claim 3, wherein said portion comprises a eutectic concentration of tin.

5. A structure as recited in claim 3, wherein said portion is adjacent to said second substrate.

6. A structure as recited in claim 3, wherein said portion is centrally located within said second solder bump.

7. A structure as recited in claim 3, wherein said portion is said entire second solder bumps.

8. A structure as recited in claim 1, wherein said second solder bumps melt at a temperature at least 25 C less than said first solder bumps.

9. A structure as recited in claim 1, wherein said first substrate comprises a first semiconductor chip.

10. A structure as recited in claim 9, wherein said second substrate comprises a second semiconductor chip.

11. A structure as recited in claim 10, wherein said second chip is larger than said first chip.

12. A structure as recited in claim 10, wherein said second chip further comprises wire bond pads for bonding to a printed circuit board.

13. The structure of claim 1, wherein said second solder bumps have a uniform composition and melt at a lower temperature than said first solder bumps.

14. A structure comprising:
    a first substrate having a main surface with first reflowed solder bumps and second reflowed solder bumps separately disposed thereacross; and
    wherein said second reflowed solder bumps have at least a portion that melted at a lower temperature than said first reflowed solder bumps, said second reflowed solder bumps comprising alignment solder bumps which when melted aligned said first substrate to a second substrate before melting said first reflowed solder bumps.

15. The structure of claim 14, wherein said second solder bumps are larger than said first solder bumps.

16. The structure of claim 14, wherein said second solder bumps melt at a temperature at least 25° C. less than said first solder bumps.

17. The structure of claim 16, wherein the first substrate comprises a semiconductor chip.

18. The structure of claim 14, wherein said second solder bumps have a uniform composition and melt at a lower temperature than said first solder bumps.

* * * * *